US009520871B2

(12) United States Patent
Eagen et al.

(10) Patent No.: US 9,520,871 B2
(45) Date of Patent: Dec. 13, 2016

(54) METHODS AND APPARATUS FOR SUPPLY VOLTAGE TRANSIENT PROTECTION FOR MAINTAINING A STATE OF A SENSOR OUTPUT SIGNAL

(75) Inventors: Jeff Eagen, Manchester, NH (US); Devon Fernandez, Londonderry, NH (US); P. Karl Scheller, Bow, NH (US)

(73) Assignee: ALLEGRO MICROSYSTEMS, LLC, Worcester, MA (US)

( * ) Notice: Subject to any disclaimer, the term of this patent is extended or adjusted under 35 U.S.C. 154(b) by 1172 days.

(21) Appl. No.: 13/344,052

(22) Filed: Jan. 5, 2012

(65) Prior Publication Data

US 2013/0176012 A1   Jul. 11, 2013

(51) Int. Cl.
*H03K 17/24* (2006.01)
*H02M 1/32* (2007.01)
*H03K 17/94* (2006.01)

(52) U.S. Cl.
CPC ............... *H03K 17/24* (2013.01); *H02M 1/32* (2013.01); *H03K 17/94* (2013.01)

(58) Field of Classification Search
CPC ........ H03K 17/24; H03K 17/94; H03K 17/00; H03K 17/6871; H03K 19/096; H02M 2001/0032; H02M 1/32; G05F 1/10
USPC ................. 323/283–285, 274–277, 246, 271
See application file for complete search history.

(56) References Cited

U.S. PATENT DOCUMENTS

| | | | |
|---|---|---|---|
| 4,144,519 A | 3/1979 | Chamuel | |
| 4,185,265 A | 1/1980 | Griffin et al. | |
| 4,293,814 A | 10/1981 | Boyer | |
| 4,367,721 A | 1/1983 | Boyer | |
| 4,374,333 A | 2/1983 | Avery | |
| 4,443,716 A | 4/1984 | Avery | |
| 4,476,901 A | 10/1984 | Sainen | |
| 4,705,964 A | 11/1987 | Higgs | |
| 4,906,928 A | 3/1990 | Gard | |
| 4,992,731 A | 2/1991 | Lorenzen | |
| 5,103,171 A | 4/1992 | Petersen | |
| 5,291,133 A | 3/1994 | Gokhale et al. | |
| 5,317,258 A | 5/1994 | Setzer et al. | |
| 5,442,283 A | 8/1995 | Vig et al. | |
| 5,459,398 A | 10/1995 | Hansen et al. | |

(Continued)

FOREIGN PATENT DOCUMENTS

| | | |
|---|---|---|
| EP | 0036950 A1 | 2/1981 |
| EP | 0602697 A1 | 11/1993 |

(Continued)

OTHER PUBLICATIONS

Notification of Transmittal of the International Search Report and the Written Opinion of the International Searching Authority, or the Declaration, PCT/US2012/068850, date of mailing Mar. 25, 2013, 5 pages.

(Continued)

*Primary Examiner* — Gustavo Rosario Benitez
(74) *Attorney, Agent, or Firm* — Daly, Crowley Mofford & Durkee, LLP

(57) ABSTRACT

Methods and apparatus for an integrated circuit that includes a supply voltage transient detection module to activate a hold signal that causes the output to remain in its present state. In one embodiment, the output remains in that state until the supply voltage returns to a normal operating range and the hold signal transitions to an inactive state.

11 Claims, 7 Drawing Sheets

(56) References Cited

U.S. PATENT DOCUMENTS

| | | | |
|---|---|---|---|
| 5,469,090 A | 11/1995 | Narahara | |
| 5,477,142 A | 12/1995 | Good et al. | |
| 5,493,219 A * | 2/1996 | Makino | G01D 1/12 324/174 |
| 5,497,084 A | 3/1996 | Bicking | |
| 5,510,706 A | 4/1996 | Good | |
| 5,650,719 A | 7/1997 | Moody et al. | |
| 5,694,038 A | 12/1997 | Moody et al. | |
| 5,729,127 A | 3/1998 | Tamura et al. | |
| 5,821,745 A | 10/1998 | Makino et al. | |
| 5,917,320 A | 6/1999 | Scheller et al. | |
| 6,091,239 A | 7/2000 | Vig et al. | |
| 6,100,680 A | 8/2000 | Vig et al. | |
| 6,232,768 B1 | 5/2001 | Moody et al. | |
| 6,242,908 B1 | 6/2001 | Scheller et al. | |
| 6,297,627 B1 | 10/2001 | Towne et al. | |
| 6,417,662 B1 | 7/2002 | Wallrafen | |
| 6,525,531 B2 | 2/2003 | Forrest et al. | |
| 6,693,419 B2 | 2/2004 | Stauth et al. | |
| 6,919,720 B2 | 7/2005 | Vig et al. | |
| 7,046,000 B1 | 5/2006 | Hara et al. | |
| 7,138,793 B1 * | 11/2006 | Bailey | G01D 5/14 324/207.12 |
| 7,199,579 B2 | 4/2007 | Scheller et al. | |
| 7,362,094 B2 | 4/2008 | Voisine et al. | |
| 7,365,530 B2 | 4/2008 | Bailey et al. | |
| 7,619,406 B2 | 11/2009 | Voisine et al. | |
| 2001/0009367 A1 | 7/2001 | Sietzer et al. | |
| 2003/0145663 A1 | 8/2003 | Heisenberg et al. | |
| 2007/0164732 A1 | 7/2007 | Voisine et al. | |
| 2008/0284389 A1 * | 11/2008 | Kawase et al. | 323/266 |
| 2009/0212771 A1 * | 8/2009 | Cummings | G01R 15/205 324/252 |
| 2010/0231202 A1 * | 9/2010 | Scheller et al. | 324/173 |

FOREIGN PATENT DOCUMENTS

| | | |
|---|---|---|
| EP | 0621460 A1 | 4/1994 |
| EP | 0875733 A2 | 4/1998 |
| EP | 0875774 A2 | 4/1998 |
| EP | 1211500 A1 | 5/2002 |
| EP | 2003532 A2 | 12/2008 |
| GB | 2309311 A | 1/1997 |
| JP | 4-353765 | 4/1992 |
| JP | 6-18905 | 3/1994 |
| JP | H10-48268 | 2/1998 |
| JP | 2000-249728 | 9/2000 |
| WO | WO00/57136 | 9/2000 |

OTHER PUBLICATIONS

Written Opinion of the International Searching Authority, PCT/US2012/068850, date of mailing Mar. 25, 2013, 7 pages.

Corrected Version of International Search Report dated Apr. 11, 2013 for International Appl. No. PCT/US2012/068850, filed on Dec. 11, 2012.

Allegro Microsystems, Inc. Concept Datasheet ATS673 and ATS674, "Self-Calibrating TPOS Gear Tooth Sensor Optimized for Automotive Cam Sensing Applications", 2005, 20 pages.

"An Engineering Approach to Digital Design", William I. Fletcher, pp. 1, 2, 14-19, Prentice Hall, Inc. 1980.

"Data Acquisition and Conversion Handbook", pp. 1-3, 16-17, Datel-Intersil, Inc., Mansfield, Massachusetts, 1979.

"ATS612LSB, Advanced Information Data Sheet", Datasheet 27627.101, Allegro Microsystems, Inc., 115 Northeast Cutoff, Box 15036, Worcester, MA 01615-0036, pp. 1-16, Sep. 1996.

ATS630LSA and ATS631LSA, Zero-Speed, Self-Calibrating, Hall-Effect Gear-Tooth True Power-On Sensors, Data Sheet 27627.120, Allegro MicroSystems, Inc., 115 Northeast Cutoff, Box 15036, Worcester, MA 01615-0036, 12 pages, Oct. 28, 2996.

"Motorola Linear/Interface Integrated Circuits", data sheet, Series D, Motorola Inc., 1983, 2 pages.

Operational Amplifiers Design and Applications, Jerald G. Graeme, et al., McGraw-Hill Book Company, pp. 1, 352-353, not dated.

"ATS630, ATS631; True Power On, Self-Calibrating Zero Speed Gear Tooth Sensor System", Preliminary Data Sheet, Allegro MicroSystems, Inc., Rev. 2.6; R. Vig, pp. 1-8, not dated.

International Preliminary Report on Patentability (Form PCT/IB/373) for PCT/US2006/040465, dated Jul. 22, 2008, 8 pages.

International Search Report (Form PCT/ISA/210) and Written Opinion of the International Searching Authority (Form PCT/ISA/237), for PCT/US2006/040465, Feb. 6, 2007, 10 pages.

International Search Report (Form PCT/ISA/210) and Written Opinion of the International Searching Authority (Form PCT/ISA/237), for PCT/US2006/040465, Apr. 23, 2007, 10 pages.

U.S. Appl. No. 7,548,056 issued on Jun. 16, 2009; Part 1 of 2, 317 pages.

U.S. Appl. No. 7,548,056 issued on Jun. 16, 2009; Part 2 of 2, 312 pages.

Notification Concerning Transmittal of International Preliminary Report on Patentability (Chapter 1 of the Patent Cooperation Treaty), PCT/US2012/068850, date of mailing Jul. 17, 2014, 8 pages.

* cited by examiner

METHODS AND APPARATUS FOR SUPPLY VOLTAGE TRANSIENT PROTECTION FOR MAINTAINING A STATE OF A SENSOR OUTPUT SIGNAL

BACKGROUND

As is known in the art, integrated circuits (ICs) in a package and/or circuit board typically require a regulated supply voltage to enable operation. Voltage transients, such as voltage drops, in a regulator output voltage, for example, can cause outputs and/or signal processing circuitry to reset or transition to unknown processing states and/or output states. For relatively minor transients, it may be desirable to prevent a reset from occurring. For example, in certain applications, such as vehicle power systems, the environment is inherently noisy. In addition, test protocols can require testing the response of a sensor and/or IC to supply voltage transients. In such environments, it is undesirable to reset a sensor and/or IC for relatively minor voltage transients.

SUMMARY

Embodiments of the present invention provide methods and apparatus for an integrated circuit that includes a supply voltage transient detection module to activate a hold signal that causes the output to remain in its present state. In one embodiment, the output remains in that state until the supply voltage returns to a normal operating range and the hold signal transitions to an inactive state. With this arrangement, transient supply voltage drops do not reset the output. While exemplary embodiments of the invention are shown and described in conjunction with certain types of ICs, it is understood that embodiments of the invention are applicable to circuits in general for which it is desirable to prevent supply voltage transients from resetting output signals and/or interrupting internal signal processing.

In one aspect of the invention, a sensor comprises a regulator voltage monitor module to receive a regulated output voltage and transition a first hold signal to an active state when the regulated output voltage drops below a first threshold and transition a second hold signal to an active state when the regulated output voltage drops below a second threshold, a signal processing module to receive the first hold signal from the regulator voltage monitor module and hold processing in a state corresponding to a time the first hold signal transitions to the active state, and an output module for outputting a sensor output signal, the output module to receive the second hold signal from the regulator voltage monitor module and to maintain a state of the sensor output signal at the time the second hold signal transitions to an active state.

The sensor can further including one or more of the following features: the regulator voltage monitor is configured to generate a third hold signal for the output module to cause the output module to transition the sensor output signal to a high impedance state, the third hold signal to transition to an active state when the regulator voltage drops below a third threshold lower than the first threshold, the first and second thresholds are the same, a regulator to provide the regulated output voltage, the first hold signal remains in the active state until the regulated voltage signal rises above the first threshold, the sensor resets when the regulated output voltage drops below a reset threshold voltage level, a magnetic field sensor, and/or a signal processing module includes at least one counter that does not change in value during a time in which the first hold signal is in the active state.

In another aspect of the invention, a sensor comprises a regulator voltage monitor means to receive a regulated output voltage and transition a first hold signal to an active state when the regulated output voltage drops below a first threshold and transition a second hold signal to an active state when the regulated output voltage drops below a second threshold, a signal processing means to receive the first hold signal from the regulator voltage monitor means and hold processing in a state corresponding to a time the first hold signal transitions to the active state, and an output means for outputting a sensor output signal, the output module to receive the second hold signal from the regulator voltage monitor means and to maintain a state of the sensor output signal at the time the second hold signal transitions to an active state. The sensor can further include an output switch and/or signal processing means comprising a magnetic field sensor.

In a further aspect of the invention, a method comprises receiving a regulated output voltage, transitioning a first hold signal to an active state when the regulated output voltage drops below a first threshold, transitioning a second hold signal to an active state when the regulated output voltage drops below a second threshold, receiving the first hold signal and holding signal processing in a state corresponding to a time at which the first hold signal transitioned to the active state, receiving the second hold signal, and outputting a sensor output signal for a sensor and maintaining a state of the sensor output signal present at the time at which the second hold signal transitioned to the active state.

The method can further include one or more of the following features: generating a third hold signal to transition the sensor output signal to a high impedance state, the third hold signal to transition to an active state when the regulator voltage drops below a third threshold lower than the first threshold, the first and second thresholds are the same, the first hold signal remains in the active state until the regulated voltage signal rises above the first threshold, the sensor resets when the regulated output voltage drops below a reset threshold voltage level, processing information from a magnetic field sensor; and/or the signal processing includes at least one counter that does not change in value during a time in which the first hold signal is in the active state.

BRIEF DESCRIPTION OF THE DRAWINGS

The foregoing features of this invention, as well as the invention itself, may be more fully understood from the following description of the drawings in which.

DETAILED DESCRIPTION

Figure 1:
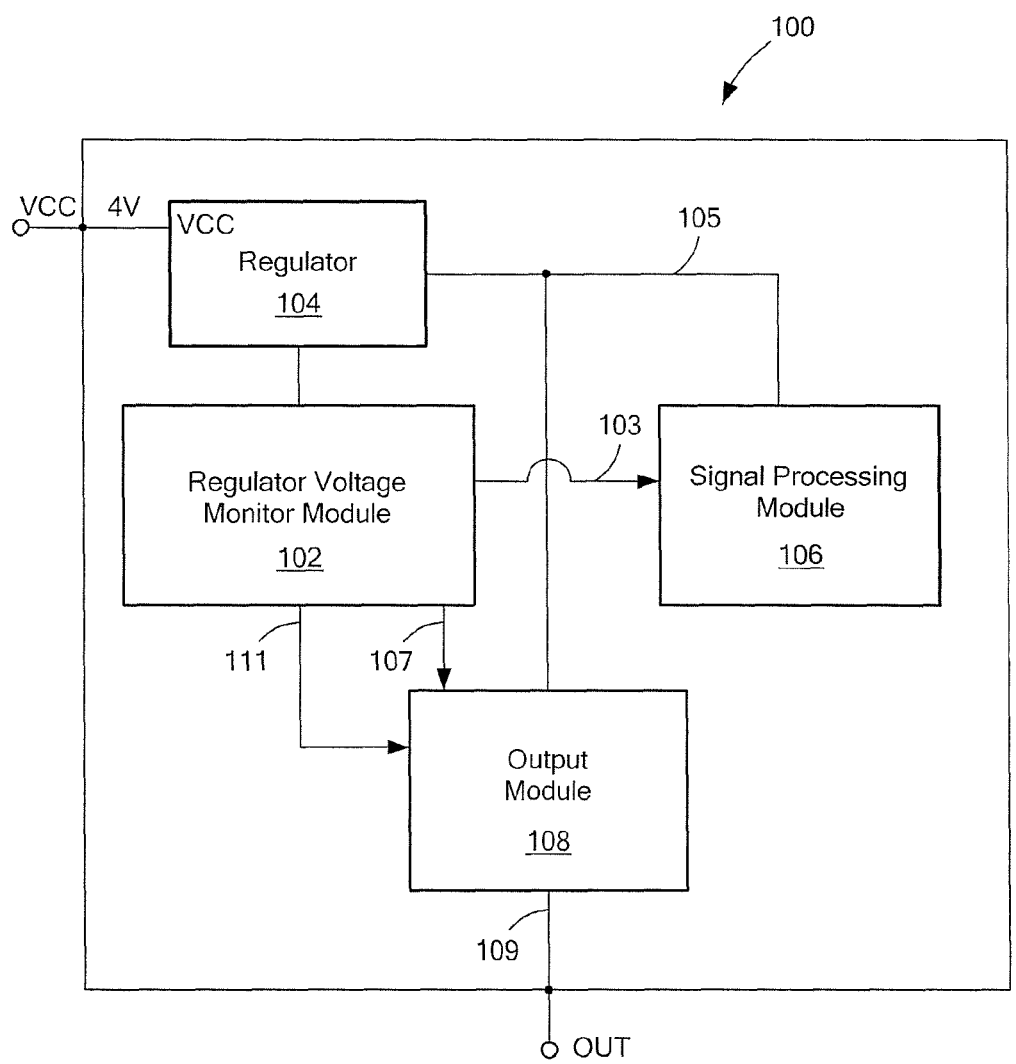
FIG. 1 shows an exemplary integrated circuit having voltage supply monitoring in accordance with exemplary embodiments of the invention.

FIG. 1 shows an exemplary integrated circuit (IC) 100 having a regulator voltage monitor module 102 coupled to a regulator 104 in accordance with exemplary embodiments of the invention. The regulator 104 is coupled to a supply voltage signal, such as a 4V VCC signal, to provide a regulated voltage 105 to the regulator voltage monitoring module 102, a signal processing module 106, an output module 108, and other circuitry requiring a regulated voltage.

Figure 1A:
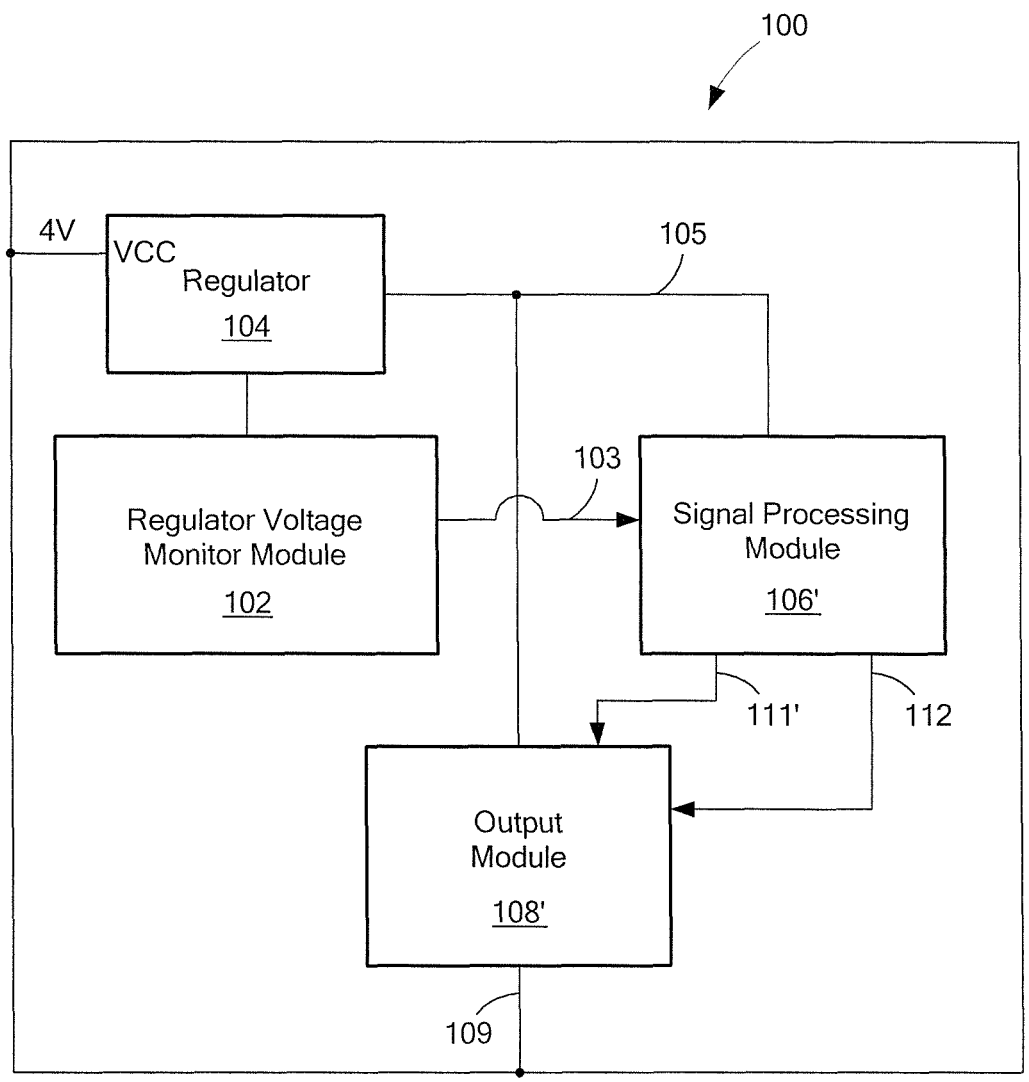
FIG. 1A shows an alternative integrated circuit having voltage supply monitoring in accordance with exemplary embodiments of the invention.

The regulator voltage monitor module 102 generates a hold processing signal 103 for the signal processing module 106 and a hold output signal 107 for the output module 108, which provides the IC output signal 109. It is the understood that the hold processing signal 103 and the hold output signal 107 can be generated as distinct signals having different thresholds and/or timing, or can be essentially the same signal. In one embodiment, the regulator voltage monitoring module 102 generates an optional high out signal 111 for the output module 108. When the high out signal 111 goes active, the output signal 109 goes to a high impedance state. In an alternative embodiment shown in FIG. 1A, the signal processing module 106' generates a hold output signal 112 and/or a high out signal 111' for the output module 108'.

Figure 1B:
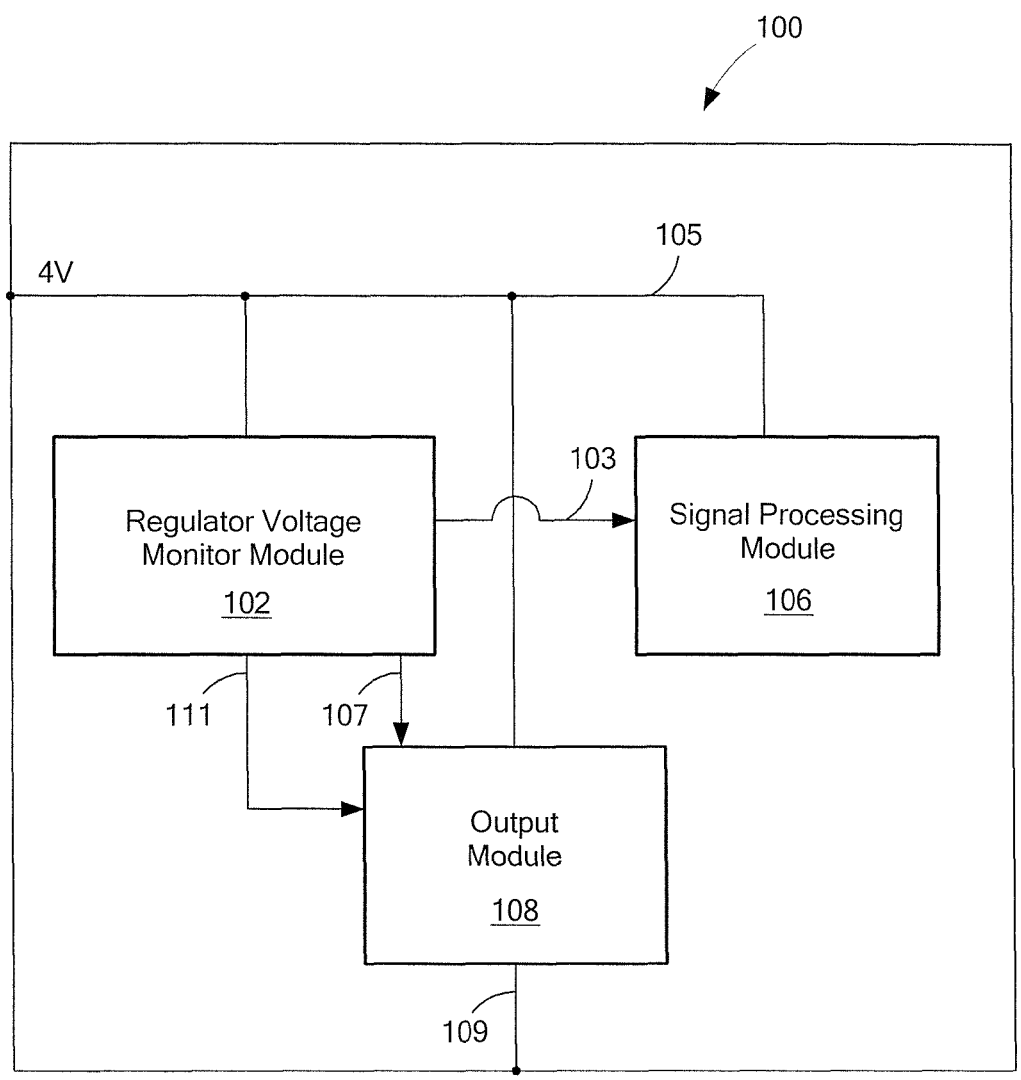
FIG. 1B shows a further alternative integrated circuit having voltage supply monitoring in accordance with exemplary embodiments of the invention.

It is understood that the regulator can be external to the IC, as shown in FIG. 1B. In addition, it should be understood that some supplies, such as a battery, are sufficiently stable without any explicit regulator circuitry.

In general, exemplary embodiments of the present invention prevent a transient drop in the voltage regulator output 105 from causing output errors. It is understood that a full reset may cause an output error in many situations, but preventing the reset doesn't necessarily prevent output errors. It is further understood that a partial reset does not always cause an error.

If the voltage regulator output 105 drops below a hold threshold the regulator voltage monitor module 102 transitions the hold output signal 107 to an active state so that the current output state of the output module 108 is maintained until the voltage regulator output 105 rises above the hold threshold or other threshold, as determined by the regulator voltage monitor module 102. The regulator voltage monitor module 102 also transitions the hold processing signal 103 sent to the signal processing module 106. Processing in the signal processing module 106, which can include a state machine, can be maintained at the present state instead of resetting, as in conventional sensors. By preventing a reset of the device due to a relatively minor voltage transient, signal processing can continue when the voltage regulator output 105 returns to normal voltage levels. If the voltage regulator output 105 drops further to below an optional high impedance threshold the high out signal 111 becomes active and the output module 108 transitions the output signal 109 to a high impedance state.

Figure 2:
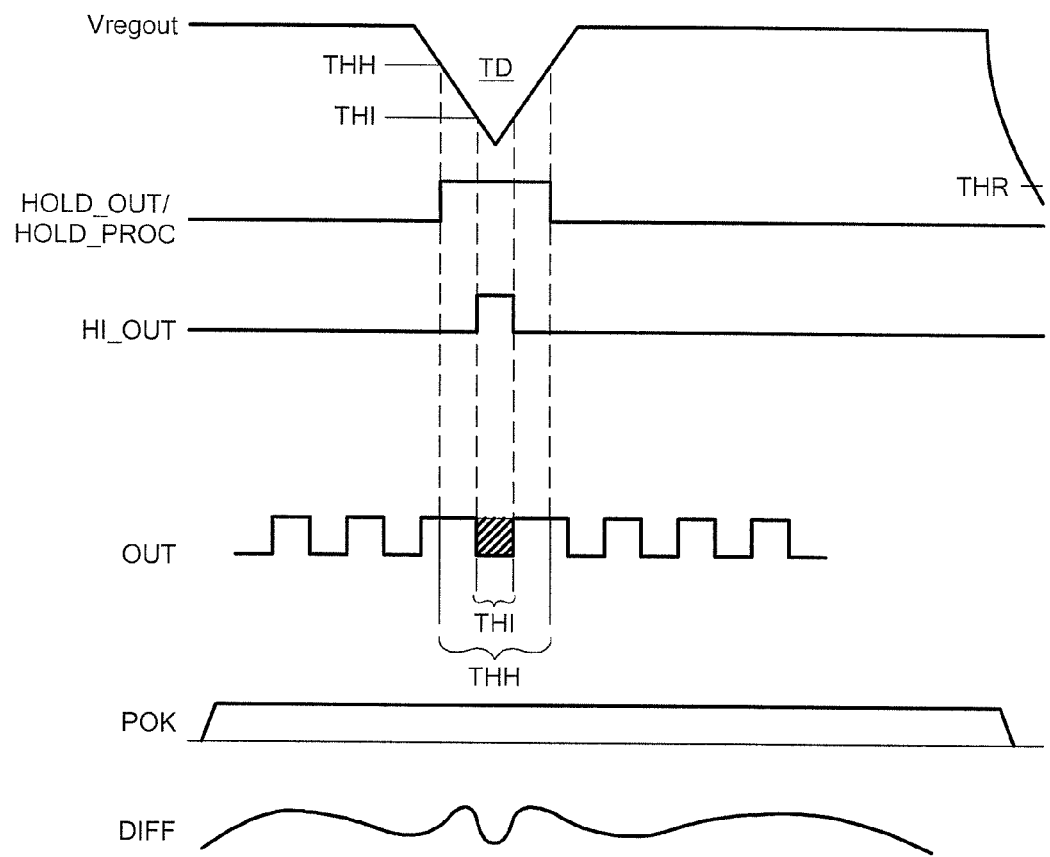
FIG. 2 is a timing diagram of signals to provide voltage supply monitoring in accordance with exemplary embodiments of the invention.

FIG. 2, in conjunction with the diagram of FIG. 1, shows an exemplary signal diagram including a regulator output voltage signal Vregout (105) having a transient drop TD. In an exemplary embodiment, when the regulator output voltage Vregout (105) falls below a first down threshold THH, the hold output signal HOLD_OUT (107), which is coupled to the output module 108, transitions to an active state. The hold processing signal HOLD_PROC (103), which can have the same or different threshold as the hold output signal HOLD_OUT, also transitions to an active state. In response to the transition of the hold output signal HOLD_OUT, the output module 108 holds the output signal OUT (109) in its present state. While a further and/or sustained drop in the voltage regulator output Vregout (105) below a reset threshold THR will reset the device, which is desired, transient voltage drops will not reset the device to allow continued operation as the transient dissipates.

If the regulator voltage Vregout falls below a second down threshold THI, the optional high out signal HI_OUT (111) is activated to cause the output module 108 to transition the output 109 to a high impedance state. It is understood that without the second down threshold THI, the output signal OUT would not go to a high impedance state, but rather, would remain in the state at the time the voltage regulator output Vregout goes below the first down threshold THH.

A power valid POK signal is also shown to indicate that the transient drop in the voltage regulator output 105 should not reset the device. In the illustrated embodiment, the POK signal does not transition since the transient is not significant enough to reset the device. In general, a voltage drop below THR will reset the device. The threshold for THR should be set for a voltage drop of a level and duration such that the internal circuit states, e.g., a value held in a flip-flop, cannot be trusted. This level and duration depends on details of process and circuit implementation, as will be readily appreciated by one of ordinary skill in the art.

An exemplary DIFF signal, which is described below, is also shown having a dip during the regulator output transient.

It is understood that a variety of circuits well known to one of ordinary skill in the art can be used to monitor and detect the voltage regulator output dropping below one or more thresholds.

Figure 3:
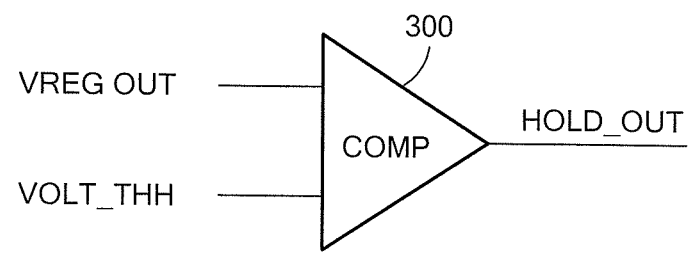
FIG. 3 is a schematic representation of an exemplary embodiment to generate hold signals for voltage supply monitoring in accordance with exemplary embodiments of the invention.
Figure 3:
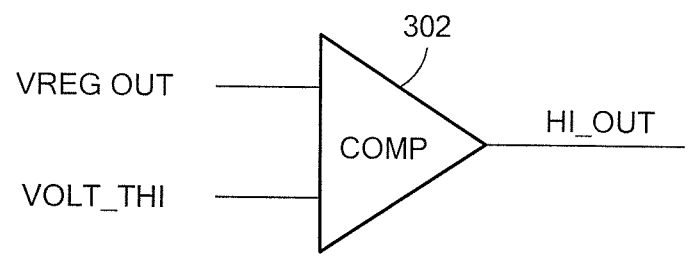
Figure 3:
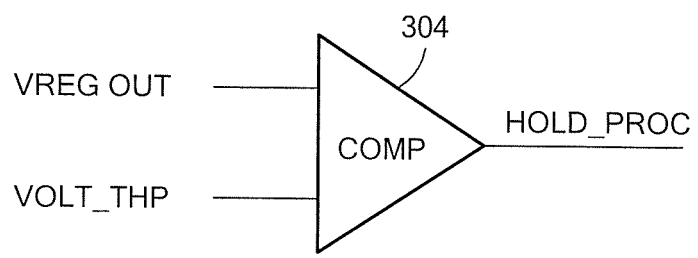

FIG. 3 shows an exemplary circuit to detect a voltage drop of the regulator output voltage Vregout below a given threshold. A first comparator 300 receives the voltage regulator output Vregout and a voltage VOLT_THH set to the first down threshold THH (see FIG. 2), which defines the voltage below which the hold output signal HOLD_OUT (107) should become active. The output of the first comparator 300 provides the hold output signal HOLD_OUT (107) to the output module 108.

Similarly, if the voltage regulator output Vregout drops below a high impedance threshold VOLT_THI, the output of a second comparator 302 transitions to activate a high out signal HI_OUT (111) causing the output module 108 to transition the output signal 109 to a high impedance state A further comparator 304 can be used to generate a HOLD_PROC signal (103) that has a different threshold VOLT_THP than for the HOLD_OUT signal. As shown in FIG. 1, a hold output signal 107 is provided to the output module 108 and a hold processing signal 103 is provided to the signal processing module 106.

In other embodiments, transient voltage drops in the regulator output voltage are handled in a variety of ways. For example, a hold signal can be active for a predetermined duration, an event, such as teeth counts, or the like. In another embodiment, further processing of input signals, such as from magnetic sensor elements, e.g., Hall elements, can be prevented. In a further embodiment, an oscillator in the signal processing module can be held or ignored to hold a given logic state. Other embodiments can latch and hold the output state, reduce the bandwidth of an analog chain to filter transients, trigger a recalibration to facilitate recovery from a transient event, perform a full chip reset under certain conditions, partially reset the device, such as recalibrating only the data potentially affected, e.g., move the threshold to a safer place until a few switches have past, return the device to a previously saved state, enable a watchdog-type feature that has no effect in normal operation but recalibrates the sensor if a problem condition is detected, reduce Icc to mitigate the severity of the regulator output transient, stop the oscillator to eliminate digital currents, place analog circuits in low power 'sleep' state, inform a user of low Vcc condition, change output levels, generate output pulses with predetermined error pulse widths, modulates Icc, and/or provide a specific error condition signal on the test pin.

Figure 4:
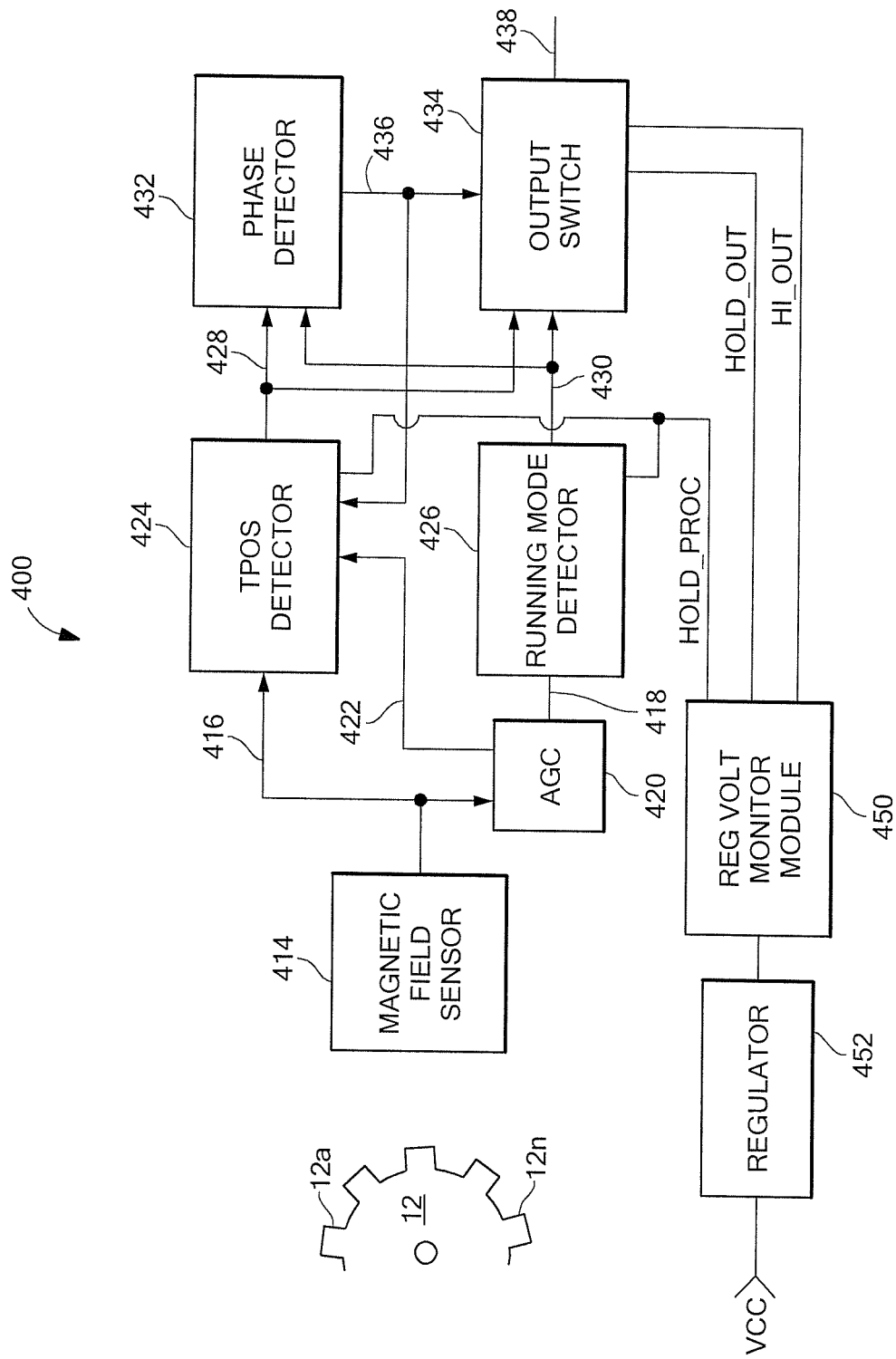
FIG. 4 is an exemplary schematic representation of voltage supply monitoring in accordance with exemplary embodiments of the invention.

FIG. 4 shows an exemplary sensor 400 having supply voltage transient protection in accordance with exemplary embodiments of the invention. It is understood that the sensor 400 is one particular embodiment of a magnetic sensor having transient protection. Other sensor embodiments having other signal processing and output configurations with inventive transient protection are well within the scope of the invention.

A magnetic article detector 400 includes regulator voltage transient protection in accordance with exemplary embodiments of the invention. A magnetic field sensor 414 provides a magnetic field sensor signal 416 that is proportional to an ambient magnetic field. The detector 400 is positioned in proximity to a magnetic article, for example a gear 12, so that the magnetic field sensor signal 416 is indicative of the profile of the magnetic article 12. The detector 400 provides a detector output signal 438 indicative of the magnetic article 12 subject to regulator voltage transient processing, as described herein. As the gear 12 passes through the ambient magnetic field a pulse train is generated indicating edges of the gear teeth 12a-12n.

The detector 400 reduces phase error in the detector output signal 438 occurring at the transition from a power up detection mode to a running detection mode and includes a first circuit 424, herein referred to as the True Power On State (TPOS) detector, that is responsive to the magnetic field sensor signal 416 to provide a first output signal 428 indicative of the passing magnetic article 12 and a second circuit 426, herein referred to as the running mode detector, that is responsive to the magnetic field sensor signal 416 to provide a second output signal 430 indicative of the passing magnetic article 12. The first output signal 428 provides the detector output signal 438 during a first time interval and the second output signal 430 provides the detector output signal 438 during a second time interval following the first time interval, as will be described.

An Automatic Gain Control (AGC) circuit 420 adjusts the gain of the magnetic field sensor signal 416 to provide a gain-adjusted version of the signal, referred to herein as the DIFF signal 418. Thus, in the illustrative embodiment, the running mode detector 426 is more directly responsive to the DIFF signal 418. The TPOS detector 424 is responsive to the AGC circuit 420 via a signal 422 for use in adjusting the TPOS threshold signal, as described below.

A phase comparator, or detector 432 is responsive to the first and second output signals 428, 430 to provide a phase detector output signal, or control signal 436 indicative of a change in the phase relationship between the first and second output signals and an output switch 434 provides the detector output signal 438 in the form of the first output signal or the second output signal in response to the control signal 436. More particularly, the phase detector output signal 436 is at a first logic level when a rising edge of the TPOS detector output signal 428 leads a rising edge of the running mode detector output signal 430 and is at a second logic level when a rising edge of the TPOS detector output signal 428 lags a rising edge of the running mode detector output signal 430. The control signal 436 is also coupled to the TPOS detector 424 as shown for use in adjusting a TPOS threshold signal, as will be described.

A HOLD_OUT signal and an optional HI_OUT signal are provided to the output switch 434 by a regulator voltage monitor module 450, which can be similar to the regulator voltage module 102 of FIG. 1, to control the output during regulator voltage transients. A regulator 452 can provide a regulated output to the regulator voltage monitor module 450 and other components. As shown in FIG. 2, if the HOLD_OUT signal output from the regulator voltage monitor module 450 becomes active, the output switch 434 maintains the state of the switch at the time the HOLD_OUT signal transitions to the active state. If the HI_OUT signal becomes active, the output switch 434 transitions to a high impedance state.

In an exemplary embodiment, a HOLD_PROC signal, which can be similar to that shown in FIG. 2, can be coupled to the TPOS detector 424 and/or running mode detector 426 to halt further signal processing.

Figure 5:
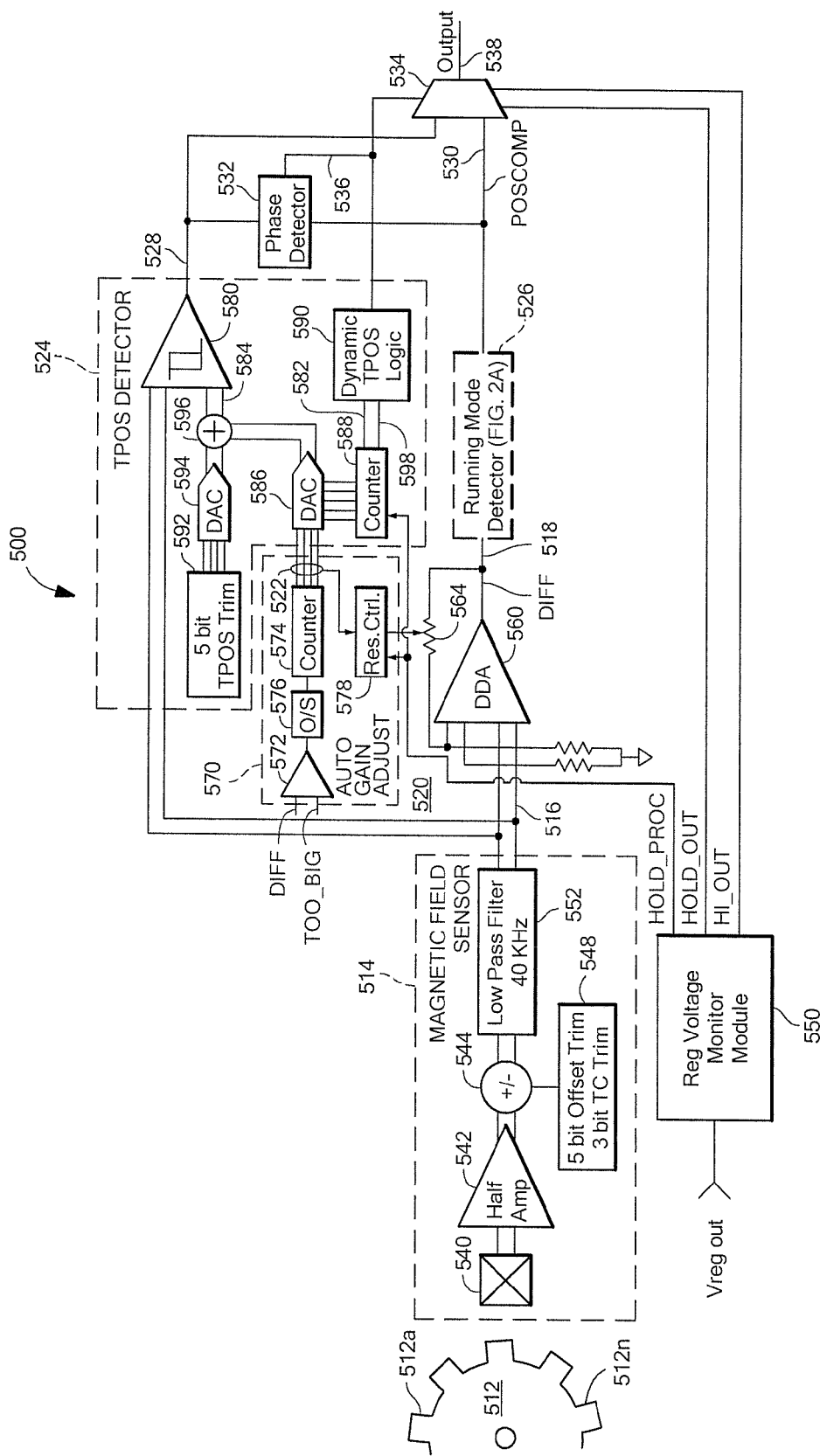
FIG. 5 is an exemplary schematic implementation of voltage supply monitoring in accordance with exemplary embodiments of the invention.

FIG. 5 shows an exemplary implementation 500 of the block diagram 400 of FIG. 4. A regulator voltage monitor module 550 receives an external regulated voltage supply signal Vcc_reg and generates a HOLD_PROC signal, a HOLD_OUT signal, and a HI_OUT signal, which are described above in FIG. 2, for example. These signals control output states and hold processing during transients drops in the regulated voltage signal Vregout.

A magnetic field sensor 514 includes a magnetic field sensing element 540. The sensing element 540 may take various forms known in the art, including but not limited to a Hall effect element, a vertical Hall effect element, a Giant Magnetoresistive (GMR) element, an Anisotropic Magnetoresistive (AMR) element, and a Tunnel Magnetoresistive (TMR) element. Also, the magnetic field sensing element 540 may comprise a single magnetically responsive element or, alternatively, may comprise a plurality of elements arranged in various configurations. In the illustrative embodiment, the magnetic field sensing element 540 is a single Hall effect element.

Various circuits and techniques may be used to process the signal provided by the magnetic field sensing element 540. In the illustrative embodiment, the signal from the Hall effect element 540 is amplified by a Hall amplifier 542 and provided to a summing node 544 for DC offset cancellation. Various conventional techniques for DC offset cancellation are possible. In the illustrative embodiment, a 5 bit offset trim and a 3 bit temperature compensation trim 548 are provided, as may be implemented with fuses and trimmed during manufacture in order to center the signal from the Hall amplifier 540 within the voltage rails of the detector 510. A low pass filter 552 is coupled to the summing node 544 to provide the magnetic field sensor signal 516, as shown.

The AGC circuit 520 adjusts the gain of the magnetic field sensor signal 516 to provide the DIFF signal 518. In larger airgap installations, the magnetic field sensor signal 516 has a lower magnitude than in smaller airgap installations. It is generally advantageous to "normalize" the size of the magnetic field sensor signal 516 for further processing and detection. To this end, the AGC circuit 520 includes a dual differential amplifier (DDA) 560 that is responsive to the differential magnetic field sensor signal 516 and to an adjustable resistive feedback element 564, as shown. The feedback element 564 is adjustable in response to an auto gain adjust circuit 570.

Various schemes are possible to provide the auto gain adjust circuit 570 and more generally, to provide automatic gain control. In the illustrated embodiment, the circuit 570 includes a comparator 572 for comparing the DIFF signal 518 to an AGC threshold signal, TOO_BIG, and for providing an output signal to a one shot 576. The one shot 576 controls a counter 574 that is incremented every time the DIFF signal 518 exceeds the level of the AGC threshold signal. The counter output 522 is used to control the resistance of element 564 via a resistor control circuit 578.

In operation, the resistance of element 564 is initially set to provide a maximum gain to the magnetic field signal 516. If the resulting DIFF signal 518 is greater than the TOO_BIG signal, indicating clipping, then the output of the comparator 572 transitions and the one shot 576 provides a pulse to increment the counter 574. The incremented counter output 522 is provided to the resistor control circuit 578 for adjustment of the resistor 564 in a manner that causes the magnitude of the magnetic field signal 516 to be reduced. This comparison of the DIFF signal to the TOO_BIG signal occurs until a predetermined number of gear teeth have passed following power up, a reset of the detector 510, or an initial gear rotation (i.e., zero speed). In the illustrative embodiment, the AGC circuit 520 is active until three gear teeth, or six gear tooth edges pass the detector 510, after which the value of resistor 564 remains constant.

Once AGC operation ends, the output signal 522 of the AGC counter 574 remains at a fixed value representative of how many gain reductions, or decrements occurred during the AGC process (i.e., how many one shot pulses occurred). For example, in the case of a large airgap, no gain decrements may occur, thereby causing the counter output 522 to remain at a value of 0000 in the illustrative 4 bit counter embodiment. Whereas, in the case of a small airgap, several gain decrements may occur, thereby causing the counter output 522 to remain at the value corresponding to the number of gain decrements occurring during AGC. The AGC counter output signal 522 is coupled to the TPOS detector 524 for use in adjusting the TPOS threshold signal, as will be described.

As is known, the use of differential elements and differential signals can be advantageous for common mode noise reduction reasons. In the illustrative embodiment, the elements and signals before the AGC circuit 520 are differential and, after the gain stage, the elements and signals, such as the DIFF signal 518, are single ended, as shown. It will be appreciated by those of ordinary skill in the art however that such design choices are based on particular circuit specifications and can be readily varied to meet different requirements.

The TPOS detector output signal 528 provides the detector output signal 538 for a first time interval, for example following power up or reset of the detector 510 because, as will become apparent, the running mode detector output signal 530 (referred to herein alternatively as the POSCOMP signal 530) may not provide accurate target detection, at least until the AGC process has been completed.

The TPOS detector 524 includes a comparator 580 having a first input (or pair of differential inputs in the case of the illustrative embodiment) responsive to the magnetic field sensor signal 516 and a second input (again, here a pair of differential inputs) responsive to a to threshold signal 584. The TPOS threshold signal 584 is initially set to a predetermined level and is adjusted from the predetermined level in order to reduce phase error once it is determined that the running mode detector output signal 530 is accurate. More particularly, the TPOS threshold signal 584 is at the predetermined level during a first portion of the first time interval and is adjusted during a second portion of the first time interval so as to minimize the phase error between edge detection by the TPOS detector and edge detection by the running mode detector.

The predetermined level to which the TPOS threshold signal 584 is initially set is selected to ensure switching on each gear tooth 512a-12n, regardless of airgap and other tolerances. This may be achieved with a TPOS trim 592 coupled to a digital-to-analog converter (DAC) 594, as shown. During manufacture, the detector 510 is tested with a target, or gear 512 positioned at the maximum specified airgaps and the TPOS detector output signal 528 is monitored to ensure switching on each gear tooth. Fuses in a resistor network are then selectively blown in order to provide a voltage level for the TPOS threshold signal 584 that ensures switching on each gear tooth regardless of airgap. In one illustrative embodiment, the TPOS threshold signal 584 is initially set to a value on the order of 50 millivolts.

The TPOS threshold signal 584 remains at the predetermined level for a first portion of the first time interval, until the running mode detector output signal 530 is accurate, following which the TPOS threshold signal is adjusted during a second portion of the first time interval. Various schemes are possible in order to determine that the running mode detector output signal 530 is accurate and thus, that the TPOS threshold signal 584 should be adjusted so as to minimize the phase error between detection by the TPOS detector and detection by the running mode detector. In one illustrative embodiment, the first portion of the first time interval ends after a predetermined number of gear tooth detections (i.e., after a predetermined number of transitions occur in the TPOS detector output signal 528). For example, in one embodiment, the predetermined number of TPOS detector output signal transitions is ten, corresponding to six transitions (i.e., three gear teeth) during which AGC is active and four transitions (i.e., two gear teeth) thereafter to ensure that the running mode detector output signal 530 is accurate.

Referring to FIG. 5 in conjunction with FIG. 2, if the regulated voltage signal Vregout decreases below a first voltage threshold THH, the HOLD_PROC and the HOLD_OUT signals transition to active states. It is understood that in other embodiments, the HOLD_PROC and HOLD_OUT signals are controlled with separate thresholds and/or timing. In an exemplary embodiment, when the HOLD_PROC goes active, the counter 588 and resistor control 578 hold their respective values during the time that the HOLD_PROC signal is active. With this arrangement, the state of signal processing is held until the supply voltage transient dissipates. Similarly, while the HOLD_OUT signal is active, the output switch 534 maintains the same output until the HOLD_OUT signal is no longer active. If the regulated voltage Vregout drops below a second threshold THI, the HI_OUT signal transitions to an active state and the output switch 534 goes to a high impedance state until the HI_OUT signal goes inactive.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A magnetic sensor in an IC package, comprising: a sensing element to sense magnetic field changes in response to movement of a target and generate a data signal corresponding to the movement of the target; a regulator voltage monitor module to receive a regulated output voltage and transition a first hold signal to an active state when the regulated output voltage drops below a first threshold and transition a second hold signal to an active state when the regulated output voltage drops below a second threshold; a signal processing module to receive the first hold signal from the regulator voltage monitor module and hold processing in a state corresponding to a time the first hold signal transitions to the active state; and an output module for outputting a sensor data output signal output from an output pin of the IC package, wherein the sensor data output signal corresponds to the data signal from the sensing element, the output module to receive the second hold signal from the regulator voltage monitor module and to maintain a state of the sensor data output signal at the time the second hold signal transitions to an active state, wherein the regulator voltage monitor is configured to generate a third hold signal for the output module to cause the output module to transition the output pin to a high impedance state, the third hold signal to transition to an active state when the regulator voltage drops below a third threshold lower than the first threshold.

2. The sensor according to claim 1, further including a regulator to provide the regulated output voltage.

3. The sensor according to claim 1, wherein the first hold signal remains in the active state until the regulated voltage signal rises above the first threshold.

4. The sensor according to claim 1, wherein the sensor resets when the regulated output voltage drops below a reset threshold voltage level.

5. The sensor according to claim 1, wherein the signal processing module includes at least one counter that does not change in value during a time in which the first hold signal is in the active state.

6. A sensor in an IC package, comprising:
a sensing element to sense magnetic field changes in response to movement of a target and generate a data signal corresponding to the movement of the target;
a regulator voltage monitor means to receive a regulated output voltage and transition a first hold signal to an active state when the regulated output voltage drops below a first threshold and transition a second hold signal to an active state when the regulated output voltage drops below a second threshold;
a signal processing means to receive the first hold signal from the regulator voltage monitor means and hold processing in a state corresponding to a time the first hold signal transitions to the active state; and
an output means for outputting a sensor output signal output from the IC package, wherein the sensor output signal corresponds to the data signal from the sensing element, the output means to receive the second hold signal from the regulator voltage monitor means and to maintain a state of the sensor output signal at the time the second hold signal transitions to an active state, wherein the regulator voltage monitor means is configured to generate a third hold signal for the output means to cause the output means to transition the output pin to a high impedance state, the third hold signal to transition to an active state when the regulator voltage drops below a third threshold lower than the first threshold.

7. The sensor according to claim 6, wherein the output means comprises a switch.

8. A method, comprising: receiving a regulated output voltage for a sensor in an IC package having a sensing element to sense magnetic field changes in response to movement of a target and generate a data signal corresponding to the movement of the target; transitioning a first hold signal to an active state when the regulated output voltage drops below a first threshold; transitioning a second hold signal to an active state when the regulated output voltage drops below a second threshold; receiving the first hold signal and holding signal processing in a state corresponding to a time at which the first hold signal transitioned to the active state; receiving the second hold signal; and outputting a sensor output signal from the IC package and maintaining a state of the sensor output signal present at the time at which the second hold signal transitioned to the active state, wherein the output signal corresponds to the data signal from the sensing element; generating a third hold signal to transition the sensor output signal to a high impedance state, the third hold signal to transition to an active state when the regulator voltage drops below a third threshold lower than the first threshold.

9. The method according to claim 8, wherein the first hold signal remains in the active state until the regulated voltage signal rises above the first threshold.

10. The method according to claim 8, wherein the sensor resets when the regulated output voltage drops below a reset threshold voltage level.

11. The method according to claim 8, wherein the signal processing includes at least one counter that does not change in value during a time in which the first hold signal is in the active state.

* * * * *

UNITED STATES PATENT AND TRADEMARK OFFICE
CERTIFICATE OF CORRECTION

| | | |
|---|---|---|
| PATENT NO. | : 9,520,871 B2 | Page 1 of 1 |
| APPLICATION NO. | : 13/344052 | |
| DATED | : December 13, 2016 | |
| INVENTOR(S) | : Jeffrey Eagen et al. | |

It is certified that error appears in the above-identified patent and that said Letters Patent is hereby corrected as shown below:

In the Specification

Column 4, Line 58 delete "impedance state", and replace with --impedance state.--.

Column 8, Line 18 delete "512a-12n,", and replace with --512a-512n,--.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*